(12) United States Patent
Duan et al.

(10) Patent No.: US 7,190,185 B2
(45) Date of Patent: Mar. 13, 2007

(54) METHODOLOGY TO MEASURE MANY MORE TRANSISTORS ON THE SAME TEST AREA

(75) Inventors: Franklin Duan, San Jose, CA (US); Minxuan Liu, San Jose, CA (US); John Walker, Colorado Springs, CO (US); Nabil Monsour, Colorado Springs, CO (US); Carl Monzel, Eagan, MN (US)

(73) Assignee: LSI Logic Corporation, Milpitas, CA (US)

( * ) Notice: Subject to any disclaimer, the term of this patent is extended or adjusted under 35 U.S.C. 154(b) by 137 days.

(21) Appl. No.: 10/696,320

(22) Filed: Oct. 29, 2003

(65) Prior Publication Data

US 2005/0093560 A1 May 5, 2005

(51) Int. Cl.
*G01R 31/02* (2006.01)
(52) U.S. Cl. ..................................... 324/763
(58) Field of Classification Search ................ 324/765, 324/760, 158.1, 763, 770, 769; 714/733, 714/734; 365/200–201
See application file for complete search history.

(56) References Cited

U.S. PATENT DOCUMENTS

| | | | | |
|---|---|---|---|---|
| 4,972,144 A * | 11/1990 | Lyon et al. ................ 324/765 |
| 5,289,116 A * | 2/1994 | Kurita et al. ............. 324/76.11 |
| 5,391,984 A * | 2/1995 | Worley ...................... 324/158.1 |
| 5,919,269 A * | 7/1999 | Ong ............................ 714/721 |
| 6,087,190 A * | 7/2000 | Wan et al. ...................... 438/11 |
| 6,160,411 A * | 12/2000 | Eliashberg et al. .......... 324/760 |
| 6,275,058 B1 * | 8/2001 | Lunde et al. ................ 324/765 |
| 6,329,831 B1 * | 12/2001 | Bui et al. .................... 324/765 |
| 6,433,568 B1 * | 8/2002 | Whipple et al. ............. 324/760 |
| 6,525,556 B2 * | 2/2003 | Matsueda .................... 324/770 |

* cited by examiner

*Primary Examiner*—Ha Tran Nguyen
*Assistant Examiner*—Tung X. Nguyen
(74) *Attorney, Agent, or Firm*—Trexler, Bushnell, Giangiorgi, Blackstone & Marr, Ltd

(57) ABSTRACT

A test methodology which provides that test structures, such as transistors, are arranged in a plurality of rows. A logic circuit controls which row is to be measured. An incrementer receives a triggering signal and functions as an address adder. Each time the triggering signal rises from 0 to 1, the output of the incrementer increases by 1. The output of the incrementer serves as the address input into a decoder. The decoder is connected to the rows of test structures. Preferably, each test structure contains a control circuit which is controlled by this signal (i.e., the output of the decoder). If the test structures are transistors, bias to each of the transistors can be applied separately with a common gate, source and well, and measurement can be done with a separate drain node.

17 Claims, 3 Drawing Sheets

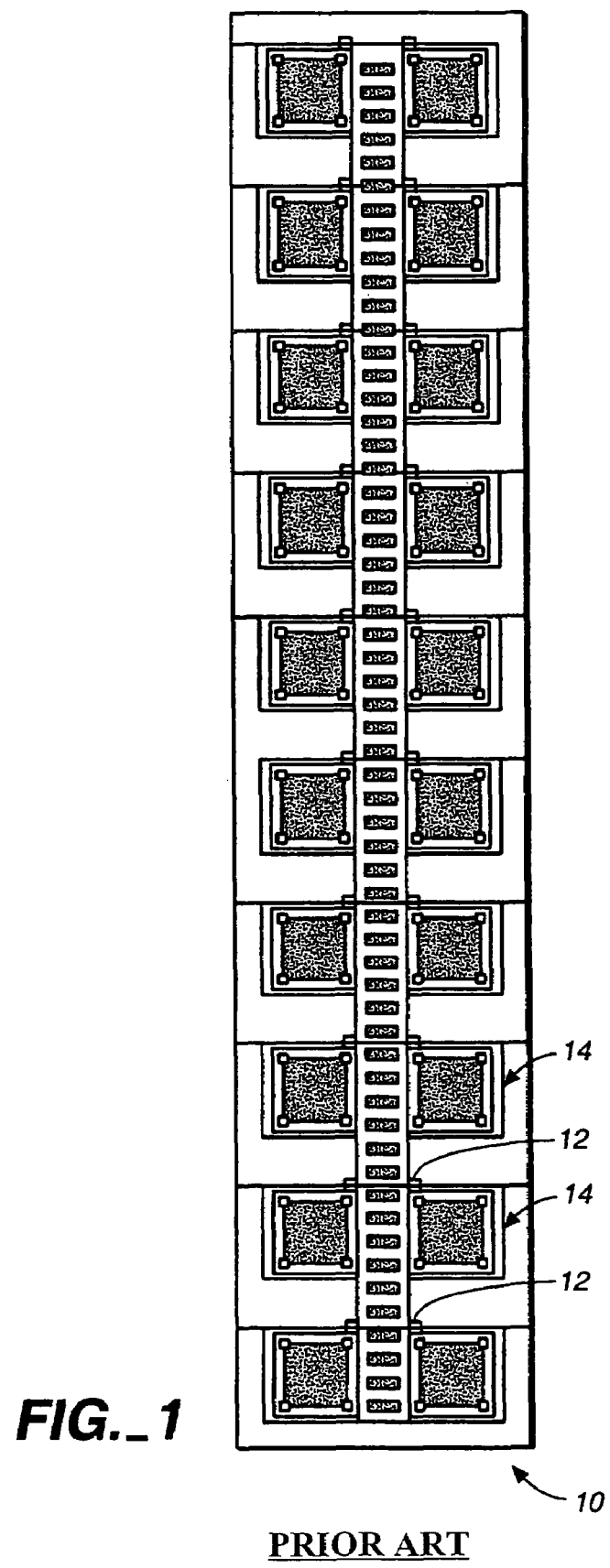
FIG._1
PRIOR ART

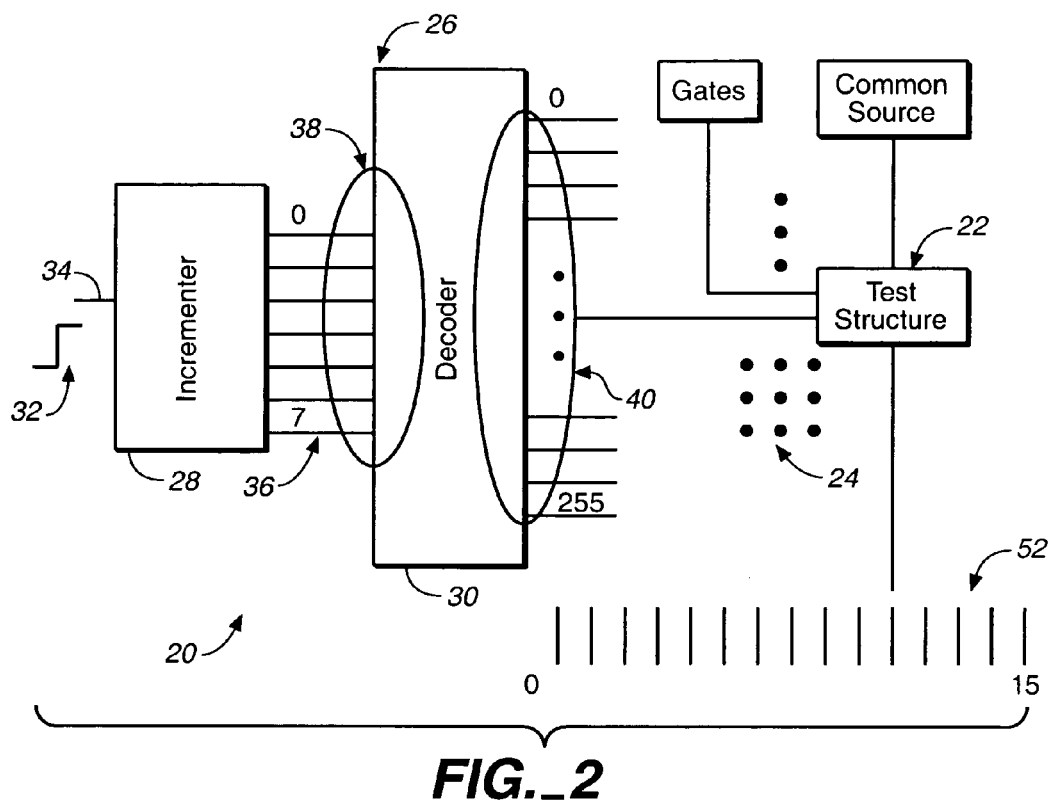
FIG._2
| Outputs Trigger | 7 | 6 | 5 | 4 | 3 | 2 | 1 | 0 |
|---|---|---|---|---|---|---|---|---|
| 1st | 0 | 0 | 0 | 0 | 0 | 0 | 0 | 1 |
| 2nd | 0 | 0 | 0 | 0 | 0 | 0 | 1 | 0 |
| 3rd | 0 | 0 | 0 | 0 | 0 | 0 | 1 | 1 |
| | | | • • • • • • | | | • • • • • • | | |
| 256th | 1 | 1 | 1 | 1 | 1 | 1 | 1 | 1 |
FIG._3

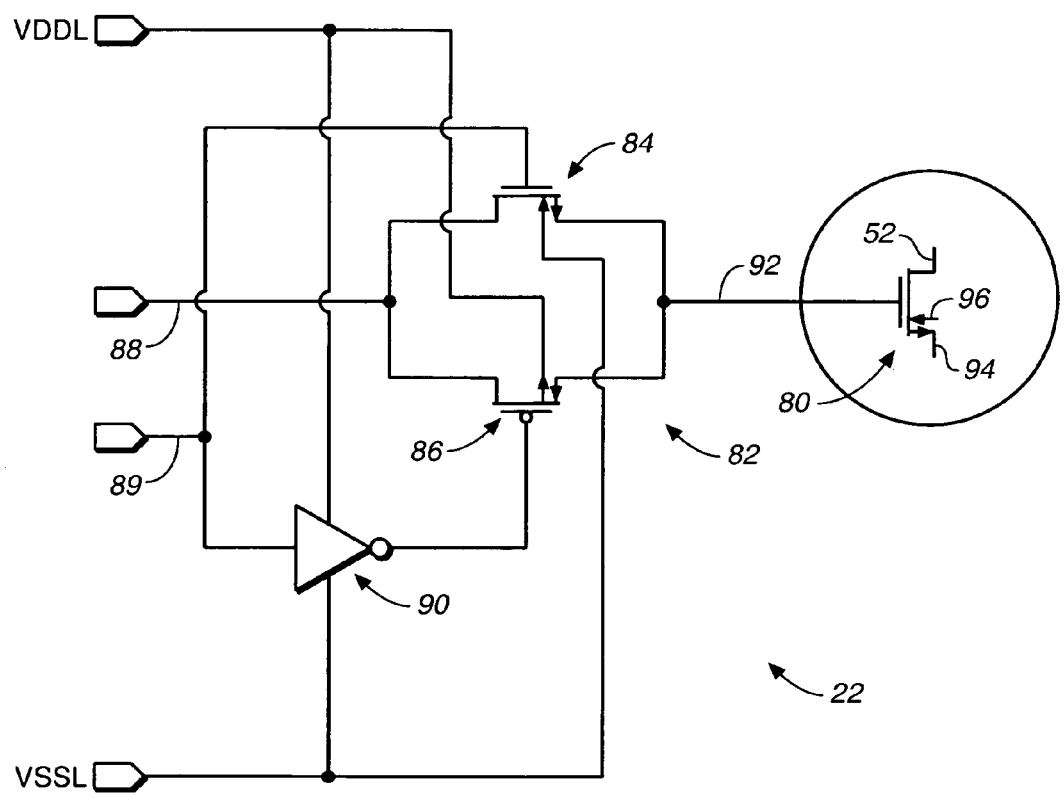
FIG._4
FIG._5

METHODOLOGY TO MEASURE MANY MORE TRANSISTORS ON THE SAME TEST AREA

BACKGROUND

The present invention generally relates to methodologies for measuring transistors, and more specifically relates to a new methodology for measuring many more transistors on a given test area than a conventional methodology provides.

A conventional method to measure a transistor matrix is illustrated in FIG. 1. As shown, the methodology provides that a pad group 10 is used (as an example, FIG. 1 illustrates a 2×10 pad group). In the methodology, test structures 12 (i.e., transistors) are placed in empty spaces between the pads 14. Using a shared gate and source, one 2×10 pad group can bold up to 9 test structures (i.e., transistors).

One drawback of this methodology is the effective usable area for transistor measurement is very small compared to the total test structure area. For example, in the 2×10 pad group as illustrated in FIG. 1, the effective transistor area is only up to 0.6% of the total test structure area.

OBJECTS AND SUMMARY

An object of an embodiment of the present invention is to provide a test methodology which allows for more efficient use of a given test structure area.

Another object of an embodiment of the present invention is to provide a test methodology which provides that effective transistor area is increased with regard to a given test structure area.

Still another object of an embodiment of the present invention is to provide a test methodology which uses a test area much more efficiently.

Briefly, and in accordance with at least one of the foregoing objects, an embodiment of the present invention provides a system for testing test structures. The system provides that the test structures, such as transistors, are arranged in a plurality of test array rows. A logic circuit controls which test structures are to be measured (i.e., which row of test structures is to be measured).

Specifically, preferably an incrementer is configured to receive a triggering signal, and the incrementer is configured to function as an address adder. More specifically, preferably the incrementer is configured such that each time the triggering signal rises from 0 to 1 the output of the incrementer increases by 1 (i.e., a different sequence of output lines becomes active). Preferably, the output of the incrementer serves as the address input into a decoder, and the decoder is connected to the rows of test structures and is configured to activate one row at a time. Preferably, each test structure contains a control circuit which is controlled by this signal (i.e., the output of the decoder). If the test structures are transistors, bias to each of the transistors can be applied separately with a common gate, source and well, and measurement can be done with a separate drain node.

BRIEF DESCRIPTION OF THE DRAWINGS

The organization and manner of the structure and operation of the invention, together with further objects and advantages thereof, may best be understood by reference to the following description, taken in connection with the accompanying drawing, wherein:

FIG. 1 illustrates use of a 2×10 pad group in a conventional transistor measurement methodology;

FIG. 2 illustrates a system that includes an incrementer and decoder and is configured for testing test structures pursuant to a methodology which is in accordance with an embodiment of the present invention;

FIG. 3 provides an input-output table of the incrementer illustrated in FIG. 2;

FIG. 4 provides an input table of the decoder illustrated in FIG. 2; and

FIG. 5 illustrates a test structure which can be used in association with the system illustrated in FIG. 2.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

FIG. 2 illustrates a system 20 for testing test structures 22. The system 20 provides that the test structures 22, such as transistors, are arranged in a plurality of test array rows (represented by dots 24 in FIG. 2). The system includes a logic circuit 26 which controls which row of test structures is to be measured. The logic circuit 26 includes an incrementer 28 and decoder 30. The incrementor 28 is configured to receive a triggering signal 32 through an input 34 and function as an address adder. More specifically, preferably the incrementer 28 is configured such that each time the triggering signal 32 rises from 0 to 1, the output 36 of the incrementer 28 increases by 1 (i.e., a different sequence of output lines 38 becomes active). FIG. 3 provides an input-output table of the incrementer 28, wherein the incrementer 28 has eight output lines 38 providing 256 possible output line sequence combinations.

Preferably, the output 36 of the incrementer 28 serves as the address input 38 into the decoder 30, and the decoder 30 is connected to the rows of test structures and is configured to activate one row at a time. FIG. 4 provides an input table of the decoder, where the decoder has eight address inputs providing 256 possible input line sequence combinations. In such case, it would be assumed that 256 rows of test structures would be connected to the output lines 40 of the decoder 30. In FIG. 4, the input sequence which is shown in the first (i.e., left-most in the table) column 42 would provide that only the first row of test structures is on (i.e., measured), the input sequence which is shown in the second column 44 would provide that only the second row of test structures is on (i.e., measured), the input sequence which is shown in the third column 46 would provide that only the third row of test structures is on (i.e., measured), . . . the input sequence which is shown in the $256^{th}$ column 48 would provide that only the $256^{th}$ row of test structures is on (i.e., measured). When the decoder 30 is reset, none of the rows of test structures are on.

FIG. 5 illustrates an exemplary test structure 22. As shown, preferably each test structure 22 includes a Device under test (DUT) 80, i.e., a transistor, and a control circuit 82. As shown, the control circuit 82 may consist of pass gates, specifically an N-channel pass gate transistor 84 and a P-channel pass gate transistor 86 to pass over the gate voltage 88, an input control 89, and an inverter 90 to supply the pMOS pass gate 86. If the DUT 80 is a transistor, bias to each of the transistors can be applied separately with a common gate 92, source 94 and well 96, and measurement can be done with a separate drain node (identified with reference numeral 52 in FIGS. 2 and 5).

If sixteen test structures are arranged in each row, by activating one row, 16 devices can be measured simultaneously. If eight address lines into the decoder 30 are used, and each triggering signal increments one address consecutively (see the table illustrated in FIG. 3), there are 256 total possible address outputs which can be generated by the incrementer 28. From these 256 addresses, the decoder will incrementally activate 256 different rows in the test array (see the table illustrated in FIG. 4). If the test structures are arranged in 256 rows and 16 columns, 4096 transistors can be measured from this test array. To measure 4096 transistors, 256 triggering signals are needed. Of course, the less transistors desired to be measured, the less times the input signal into the incrementor needs to be triggered.

Assuming 10×5 um^2 is needed for each test structure, and 512 transistors need to be measured, 32 rows and 16 columns of test structures would be needed, with a total test area of 0.0256 mm^2. With one 2×10 pad group (240×1200 um^2), 16 pads would be used for drain outputs, one common gate, one common well, one common source, and one trigger signal. Two pad groups would be sufficient to measure the 512 transistors, a big savings compared to using 30 pad groups to measure the 512 transistors, with a total area of 8 mm^2.

The present invention provides a test methodology which allows for more efficient use of a given test structure area, provides that effective transistor area is increased with regard to a given test structure area, and that a test area is used much more efficiently than the conventional, widely used methodology.

While an embodiment of the present invention is shown and described, it is envisioned that those skilled in the art may devise various modifications of the present invention without departing from the spirit and scope of the appended claims. For example, while FIGS. 3 and 4 relate to the situation wherein the incrementor has eight output lines and the decoder has eight address inputs and 256 output lines, this is not imperative, and other sized incrementors and decoders can be used. in fact, while FIG. 2 illustrates a logic circuit which includes an incrementer and decoder, other types of logic circuits can be employed in practicing the present invention.

What is claimed is:

1. A system for testing a plurality of test structures, said system comprising a logic circuit which is configured to receive a triggering signal, said logic circuit connectable to a plurality of rows of test structures, said logic circuit configured to sequentially make high a different single row of test structures, each time the triggering signal changes, while the other rows remain low, wherein only a single row is high at any given time during the testing and the remaining rows are low, wherein the system is configured to sequentially test the rows of test structures, from a first row to a last row, a single row at a time each time the triggering signal changes.

2. A system as recited in claim 1, wherein the logic circuit is connectable to 256 rows of test structures.

3. A system as recited in claim 1, wherein the system is configured to measure transistors, wherein the test structures comprise transistors.

4. A system as recited in claim 1, wherein the logic circuit is connectable to 256 rows of transistors.

5. A system as recited in claim 1, wherein the logic circuit comprises a incrementor which is configured to receive the triggering signal.

6. A system as recited in claim 5, wherein the logic circuit further comprises a decoder which is connected to the incrementor.

7. A system as recited in claim 6, wherein the decoder is connectable to the rows of test structures.

8. A system as recited in claim 5, wherein the logic circuit comprises a incrementor and a decoder, said incrementor being configured to receive the triggering signal and having eight output lines, said eight output lines being connected to eight address inputs of said decoder, said decoder having 256 output lines, said 256 output lines being connectable to 256 rows of test structures.

9. A method for testing a plurality of test structures, said method comprising: connecting a plurality of rows of test structures to a logic circuit, providing a triggering signal to the logic circuit, wherein the logic circuit selectively turns on the rows of test structures depending on the triggering signal which is received, wherein the logic circuit sequentially makes high a different single row of test structures, each time the triggering signal changes, while the other rows remain low, wherein only a single row is high at any given time during the testing and the remaining rows are low, wherein the system is configured to sequentially test the rows of test structures, from a first row to a last row, a single row at a time each time the triggering signal changes.

10. A method as recited in claim 9, further comprising connecting the logic circuit to 256 rows of test structures.

11. A method as recited in claim 9, wherein the step of connecting a plurality of rows of test structures to a logic circuit comprises connecting a plurality of transistors to the logic circuit.

12. A method as recited in claim 9, wherein the step of connecting a plurality of rows of test structures to a logic circuit comprises connecting 256 rows of transistors to the logic circuit.

13. A method as recited in claim 9, wherein the step of providing a triggering signal to the logic circuit comprises providing the triggering signal to an incrementor.

14. A method as recited in claim 13, wherein a decoder is connected to the incrementor and said step of connecting a plurality of rows of test structures to the logic circuit comprises connecting the test structures to the decoder.

15. A method as recited in claim 13, wherein the incrementor has eight output lines, said eight output lines are connected to eight address inputs of said decoder, said decoder has 256 output lines, and said 256 output lines are connectable to 256 rows of test structures.

16. A system as recited in claim 1, wherein the logic circuit is resettable wherein none of the test structures are turned on.

17. A method as recited in claim 9, wherein the logic circuit is resettable wherein none of the test structures are turned on.

* * * * *